United States Patent
Chau et al.

(10) Patent No.: US 7,268,058 B2
(45) Date of Patent: Sep. 11, 2007

(54) TRI-GATE TRANSISTORS AND METHODS TO FABRICATE SAME

(75) Inventors: Robert Chau, Beaverton, OR (US); Suman Datta, Beaverton, OR (US); Brian S Doyle, Portland, OR (US); Been-Yih Jin, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 10/760,028

(22) Filed: Jan. 16, 2004

(65) Prior Publication Data

US 2005/0158970 A1 Jul. 21, 2005

(51) Int. Cl.
*H01L 21/76* (2006.01)
(52) U.S. Cl. .................. 438/429; 438/254; 257/E21.54
(58) Field of Classification Search ................ 438/424, 438/296, 197, 429, 254; 257/E21.54
See application file for complete search history.

(56) References Cited

U.S. PATENT DOCUMENTS

| | | |
|---|---|---|
| 4,906,589 A | 3/1990 | Chao |
| 5,124,777 A | 6/1992 | Lee |
| 5,338,959 A | 8/1994 | Kim et al. |
| 5,346,839 A | 9/1994 | Sundaresan |
| 5,466,621 A | 11/1995 | Hisamoto et al. |
| 5,545,586 A | 8/1996 | Koh et al. |
| 5,563,077 A | 10/1996 | Ha |
| 5,578,513 A | 11/1996 | Maegawa |
| 5,658,806 A | 8/1997 | Lin et al. |
| 5,701,016 A | 12/1997 | Burroughs et al. |
| 5,716,879 A | 2/1998 | Choi et al. |
| 5,827,769 A | 10/1998 | Aminzadeh et al. |
| 5,888,309 A | 3/1999 | Yu |
| 5,905,285 A | 5/1999 | Gardner et al. |
| 6,114,201 A * | 9/2000 | Wu .............................. 438/254 |
| 6,163,053 A | 12/2000 | Kawashima |
| 6,252,284 B1 | 6/2001 | Muller et al. |
| 6,376,317 B1 | 4/2002 | Forbes et al. |
| 6,396,108 B1 | 5/2002 | Krivokapic et al. |
| 6,407,442 B2 | 6/2002 | Inoue et al. |
| 6,413,802 B1 | 7/2002 | Hu et al. |

(Continued)

FOREIGN PATENT DOCUMENTS

EP 0 623 963 A1 11/1994

(Continued)

OTHER PUBLICATIONS

International Search Report PCT/US2005/000947.

(Continued)

*Primary Examiner*—Bradley K Smith
(74) *Attorney, Agent, or Firm*—Blakely, Sokoloff, Taylor & Zafman LLP (57) ABSTRACT

Embodiments of the invention provide a method for effecting uniform silicon body height for silicon-on-insulator transistor fabrication. For one embodiment, a sacrificial oxide layer is disposed upon a semiconductor substrate. The oxide layer is etched to form a trench. The trench is then filled with a semiconductor material. The semiconductor material is then planarized with the remainder of the oxide layer and the remainder of the oxide layer is then removed. The semiconductor fins thus exposed are of uniform height to within a specified tolerance.

20 Claims, 5 Drawing Sheets

U.S. PATENT DOCUMENTS

| | | | |
|---|---|---|---|
| 6,413,877 B1 | 7/2002 | Annapragada |
| 6,475,869 B1 | 11/2002 | Yu |
| 6,475,890 B1 | 11/2002 | Yu |
| 6,483,156 B1 | 11/2002 | Adkisson et al. |
| 6,525,403 B2 | 2/2003 | Inaba et al. |
| 6,562,665 B1 | 5/2003 | Yu |
| 6,611,029 B1 | 8/2003 | Ahmed et al. |
| 6,635,909 B2 | 10/2003 | Clark et al. |
| 6,645,797 B1 | 11/2003 | Buynoski et al. |
| 6,680,240 B1 | 1/2004 | Maszara |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,690 B1 | 4/2004 | Wang et al. |
| 6,730,964 B2 | 5/2004 | Horiuchi |
| 6,756,657 B1 | 6/2004 | Zhang et al. |
| 6,764,884 B1 | 7/2004 | Yu et al. |
| 6,790,733 B1 | 9/2004 | Natzle et al. |
| 6,794,313 B1 | 9/2004 | Chang |
| 6,835,618 B1 | 12/2004 | Dakshina-Murthy et al. |
| 6,858,478 B2 | 2/2005 | Chau et al. |
| 6,884,154 B2 | 4/2005 | Mizushima et al. |
| 6,921,982 B2 | 7/2005 | Joshi et al. |
| 2002/0011612 A1 | 1/2002 | Hieda |
| 2002/0036290 A1 | 3/2002 | Inaba et al. |
| 2002/0081794 A1 | 6/2002 | Ito |
| 2002/0166838 A1 | 11/2002 | Nagarajan |
| 2002/0167007 A1 | 11/2002 | Yamazaki et al. |
| 2003/0057486 A1 | 3/2003 | Gambino et al. |
| 2003/0085194 A1 | 5/2003 | Hopkins, Jr. |
| 2003/0098488 A1 | 5/2003 | O'Keeffe et al. |
| 2003/0102497 A1 | 6/2003 | Fried et al. |
| 2003/0111686 A1 | 6/2003 | Nowak |
| 2003/0122186 A1 | 7/2003 | Sekigawa et al. |
| 2003/0143791 A1* | 7/2003 | Cheong et al. ............. 438/197 |
| 2003/0151077 A1 | 8/2003 | Mathew et al. |
| 2003/0201458 A1 | 10/2003 | Clark et al. |
| 2003/0227036 A1 | 12/2003 | Sugiyama et al. |
| 2004/0031979 A1 | 2/2004 | Lochtefeld et al. |
| 2004/0036118 A1 | 2/2004 | Adadeer et al. |
| 2004/0036127 A1 | 2/2004 | Chau et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0110097 A1 | 6/2004 | Ahmed et al. |
| 2004/0119100 A1 | 6/2004 | Nowak et al. |
| 2004/0126975 A1 | 7/2004 | Ahmed et al. |
| 2004/0166642 A1 | 8/2004 | Chen et al. |
| 2004/0180494 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0219780 A1 | 11/2004 | Ohuchi |
| 2004/0227187 A1 | 11/2004 | Cheng et al. |
| 2004/0238887 A1 | 12/2004 | Nihey |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0035415 A1 | 2/2005 | Yeo et al. |
| 2005/0118790 A1 | 6/2005 | Lee et al. |
| 2005/0127362 A1 | 6/2005 | Zhang et al. |
| 2005/0145941 A1 | 7/2005 | Bedell et al. |
| 2005/0156171 A1* | 7/2005 | Brask et al. .................. 257/72 |
| 2005/0224797 A1 | 10/2005 | Ko et al. |
| 2005/0224800 A1 | 10/2005 | Lindert et al. |

FOREIGN PATENT DOCUMENTS

| | | |
|---|---|---|
| EP | 1 202 335 A2 | 5/2002 |
| EP | 1 566 422 A2 | 8/2005 |
| JP | 06177089 A | 6/1994 |
| JP | 2003298051 | 10/2003 |
| WO | WO 02/43151 A | 5/2002 |
| WO | WO 2004/059726 A1 | 7/2004 |

OTHER PUBLICATIONS

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deepsub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

International Search Report PCT/US 03/26242.

International Search Report PCT/US 03/39727.

International Search Report PCT/US 03/40320.

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (11 pgs.).

Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

Jing Guo et al. "Performance Projections for Ballistic Carbon Nanotube Field-Effect Transistors" Applied Physics Letters, vol. 80, No. 17, Apr. 29, 2002, pp. 3192-2194.

Ali Javey et al., "High-K Dielectrics for Advanced Carbon-Nanotube Transistors and Logic Gates", Advance Online Publication, Published online, Nov. 17, 2002 pp. 1-6.

Richard Martel et al., "Carbon Nanotube Field Effect Transistors for Logic Applications" IBM, T.J. Watson Research Center, 2001 IEEE, IEDM 01, pp. 159-162.

David M. Fried et al., "Improved Independent Gate N-Type FinFET Fabrication and Characterization", IEEE Electron Device Letters, vol. 24, No. 9, Sep. 2003, pp. 592-594.

David M. Fried et al., "Improved Independent Gate P-Type Independent-Gate FinFETs", IEEE Electron Device Letters, vol. 25, No. 4, Apr. 2004, pp. 199-201.

Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Charles Kuo et al., "A Capacitorless Double-Gate DRAM Cell Design for High Density Applications", 2002 IEEE International Electron Devices Meeting Technical Digest, Dec. 2002, pp. 843-846.

Takashi Ohsawa et al., "Memory Design Using a One-Transistor Gain Cell on SOI", IEEE Journal of Solid-State Circuits, vol. 37, No. 11, Nov. 2002, pp. 1510-1522.

T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).

B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Tripe Gate FinFets", IEEE 2003, pp. 135-138.

S.T. Chang et al., "3-D Simulation of Strained Si/SiGe Heterojunction FinFETs", pp. 176-177.

International Search Report PCT/US2005/010505.

International Search Report PCT/US2005/020339.

* cited by examiner

TRI-GATE TRANSISTORS AND METHODS TO FABRICATE SAME

FIELD

Embodiments of the invention relate generally to the field of integrated circuit device fabrication and more specifically to tri-gate transistor fabrication.

BACKGROUND

The trend toward increasing the number of functions of an integrated circuit device (IC device) is continuing. As the size of transistors decreases, serious drawbacks in current transistor fabrication processes become evident. For example, typical silicon-on-insulator (SOI) transistors are fabricated by coating a substrate with an insulator (e.g., glass or silicon oxide) layer. A second silicon wafer is then bonded to the insulator layer and thinned to a desired thickness (i.e., as determined by the transistor dimensions). This thinning process is very difficult to control with great accuracy.

Figure 1A:
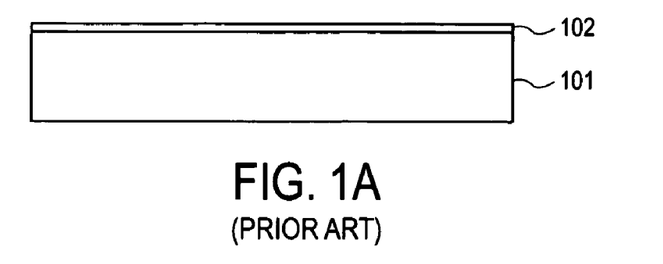
FIGS. 1A-1D illustrate a process for creating a tri-gate SOI transistor in accordance with the prior art.

FIGS. 1A-1D illustrate a portion of the fabrication process for creating a tri-gate SOI transistor in accordance with the prior art. As shown in FIG. 1A, a carrier wafer 101, typically a silicon substrate, has an insulator layer 102, typically silicon dioxide, disposed upon it. For example, a silicon dioxide layer may be grown on a silicon substrate.

Figure 1B:
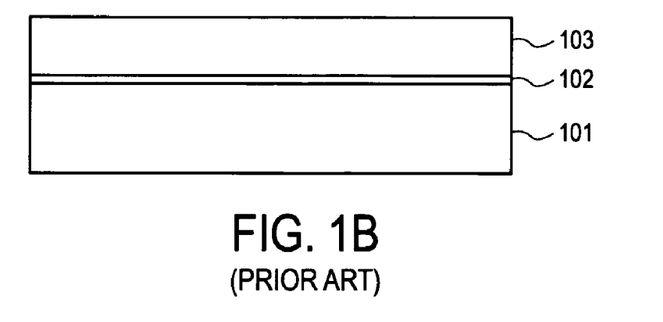

As shown in FIG. 1B, a transfer wafer 103 is then bonded to the insulator layer 102, which may facilitate the bonding. The bonding of the carrier wafer to the insulator layer may be effected though a heat-induced hydrogen bonding process. The transfer wafer, which may be, for example, silicon, is approximately 600 microns thick.

Figure 1C:
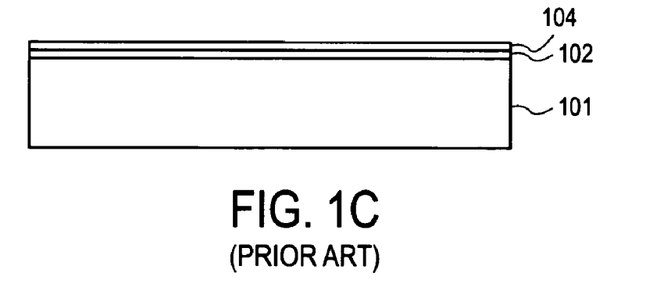
Figure 1D:
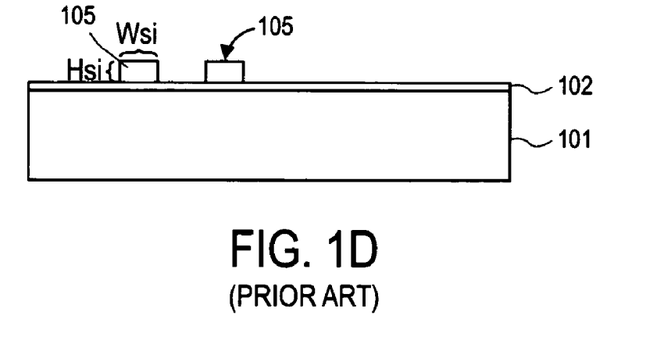

The transfer wafer is then thinned to a desired thickness based upon the transistor dimensions. Typically, this thickness is approximately 50-100 nm. The thinning of the transfer wafer may be accomplished through one of several typical processes. For example, a wet etch and polish process may be used to grind the transfer wafer to the desired thickness. An alternative method for thinning the transfer wafer includes hydrogen implantation of the transfer layer to create a weak section of the transfer wafer. The bonded pair is then heated to effect a high temperature cleave of the hydrogen-doped interface. Subsequently, the transfer wafer surface is polished or treated in other ways to planarize the surface or further reduce the thickness. These methods provide control of the thickness to within approximately several hundred angstroms. As shown in FIG. 1C, the transfer wafer 103 has been thinned to a desired dimension for the silicon body of the transistor, resulting in film layer 104. The thickness of film layer 104 is determined by the desired height of the silicon body ($H_{Si}$). The film layer 104 is then selectively etched to create silicon bodies for the transistors. As shown in FIG. 1D, selectively etching the film layer 104, using lithography techniques, results in silicon bodies 105 having a desired body width ($W_{Si}$) and body height ($H_{Si}$).

For typical transistor design architecture, gate length is proportional to $H_{Si}$, with $H_{Si}$ equal to about one-third of gate length. For typical transistors with gate lengths of approximately 20-100 nm, the desired $H_{Si}$ is greater than approximately 20 nm. Using the current fabrication method, it is possible to create adequate film layers. However, as the gate length, and hence, the desired $H_{Si}$ decreases, current fabrication methods exhibit serious disadvantages.

The $H_{Si}$ value must be uniform across a wafer in order to produce transistors with uniform characteristics. For example, the transistor threshold voltage, which is directly proportional to $H_{Si}$, should not vary by more than approximately 10%. Therefore, the film layer thickness that determines $H_{Si}$, should not vary by more than 10%.

The methods of thinning the transfer layer to obtain the film layer are capable of producing a film layer of approximately 20 nm thickness that does not vary by more than approximately 10%. However, these methods fail to produce the required uniformity for thinner film layers. Therefore, current methods of fabricating SOI transistors are incapable of yielding transistors with gate lengths smaller than approximately 50 nm.

Moreover, the process of bonding the carrier wafer and transfer wafer, and the process of thinning the transfer wafer to the desired thickness, are costly and difficult to control.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 2:
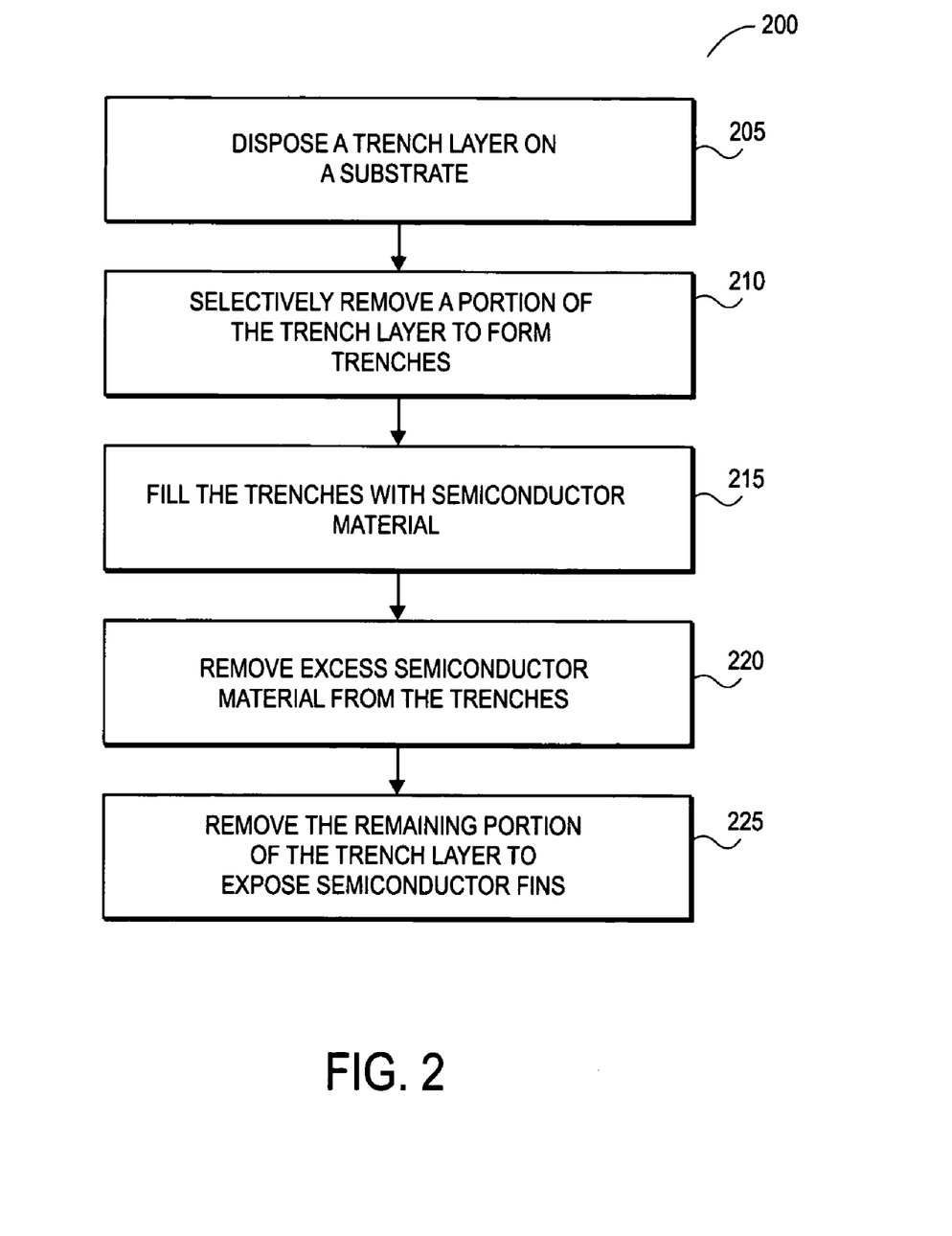
FIG. 2 illustrates a process for providing increased uniformity in silicon body height, $H_{Si}$, in accordance with one embodiment of the invention.

FIG. 2 illustrates a process for providing increased uniformity in silicon body height, $H_{Si}$, in accordance with one embodiment of the invention. Process 200, shown in FIG. 2, begins with operation 205 in which a trench layer is disposed upon a substrate layer. For one embodiment, the trench layer may be disposed upon the substrate layer using a chemical vapor deposition (CVD) process. For one embodiment, the substrate layer is silicon. For alternative embodiments, the substrate layer may be another semiconductor material such as germanium (Ge) or gallium arsenide (GaAs). For one embodiment, the trench layer thickness is determined based upon the specification of the transistor's gate length. That is, the trench layer thickness is selected to be equal to a desired $H_{Si}$ value.

At operation 210, selected portions of the trench layer are removed, thus forming trenches. For one embodiment, the trench layer is a material that can be selectively etched using conventional etching processes. For various alternative embodiments, the trench layer may be multiple layers of different materials with each material. In one such embodiment, the multiple layers of the trench layer are susceptible to different etching processes.

At operation 215, the trenches formed by operation 210, are filled with a semiconductor material (e.g., silicon). For one embodiment, the trenches are filled with epitaxial silicon using a selective epitaxial process. In an alternative embodiment, the trenches are filled in some other manner. For example, the trenches may be filled with polysilicon using a blanket deposition process.

At operation 220, the excess semiconductor material is removed. That is, semiconductor material filling the trench that extends above the surface of the remainder of the trench layer is removed. For one embodiment, a chemical-mechanical polish (CMP) is employed to planarize the surface of the semiconductor material.

At operation 225, the remainder of the trench layer is removed exposing semiconductor fins (i.e., the semiconductor material filling the trenches). For one embodiment, the height of the semiconductor fins is uniform to within less than 5%.

Figure 3A:
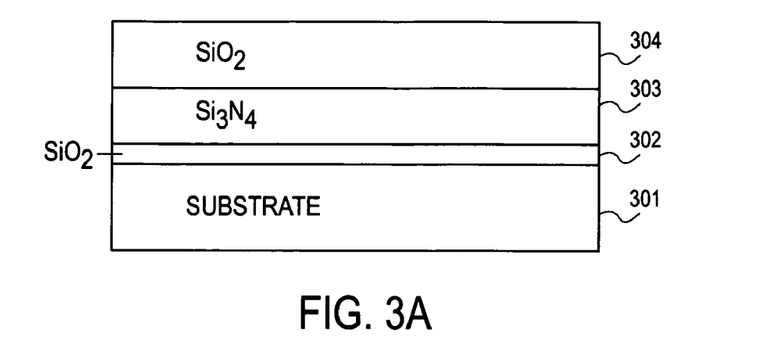
FIGS. 3A-3G illustrate the fabrication of a tri-gate transistor in accordance with one embodiment of the invention.

FIGS. 3A-3G illustrate the fabrication of a tri-gate transistor in accordance with one embodiment of the invention. FIG. 3A shows a silicon substrate 301. A multi-layer trench layer is disposed on the silicon substrate 301. The trench layer is comprised of a first oxide (e.g., $SiO_2$) layer 302, a nitride (e.g., $Si_3N_4$) layer 303, and a second oxide (e.g., $SiO_2$) layer 304. Eventually the tri-gate body thickness, $H_{Si}$, will be determined by the thickness of the second oxide layer, which is a very controllable thickness.

Figure 3B:
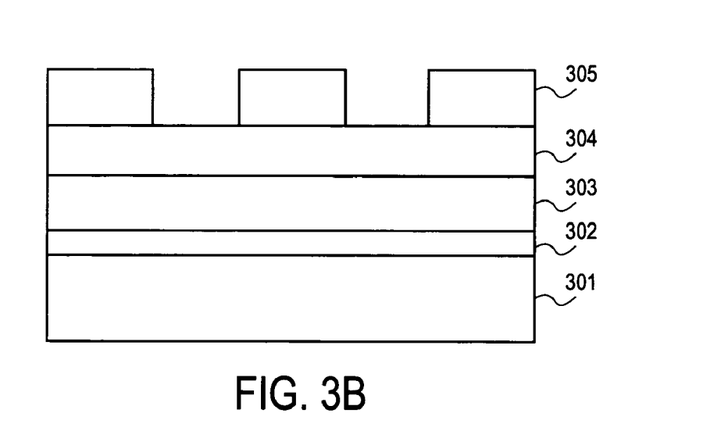

FIG. 3B illustrates the application of a photoresist mask layer 305 to define the transistor bodies. The patterning of the photoresist mask layer 305 determines the width of the silicon body, $W_{Si}$.

Figure 3C:
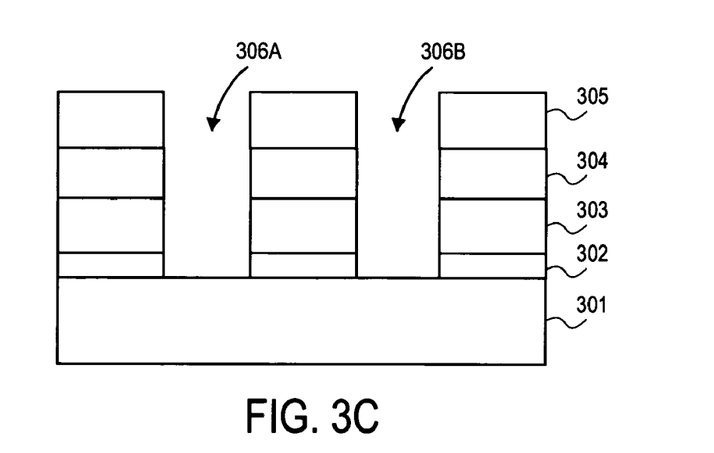

FIG. 3C illustrates the etching of the trench layer to define trenches 306a and 306b. For one embodiment, a series of three distinct dry etch processes are employed. In such an embodiment, the second oxide layer 304 is etched using a selective dry etch process in which the nitride layer 303 acts as an etch stop. Then the nitride layer 303 is etched using a different selective dry etch process in which the first oxide layer 302 acts as an etch stop. Finally, the first oxide layer 302 is etched using a dry etch process that is sufficiently selective to stop on the surface of the silicon substrate 301.

Figure 3D:
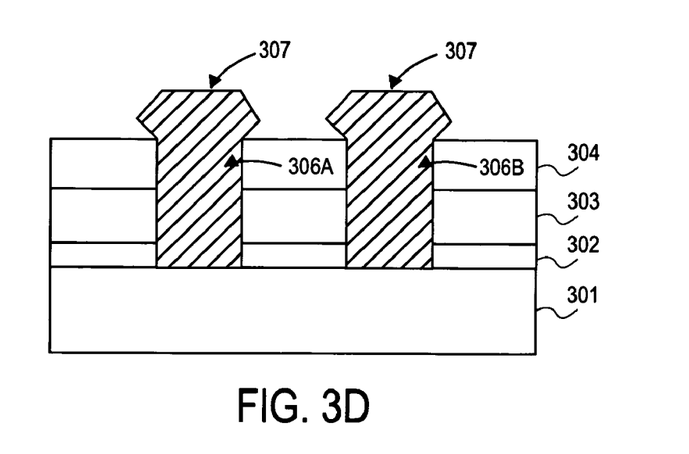

FIG. 3D illustrates filling trenches 306a and 306b with silicon 307 after the photoresist layer 305 has been stripped away, as indicated. As noted above, the trenches may be filled with silicon through various alternative methods including epitaxial growth or blanket deposition of polysilicon.

Figure 3E:
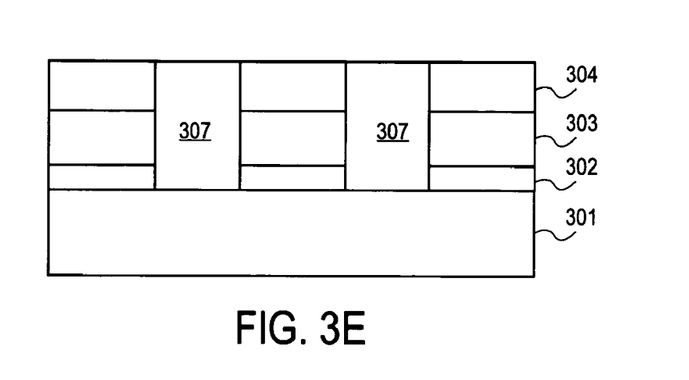

FIG. 3E illustrates the silicon 307 planarized to the level of the second oxide layer 304. For one embodiment, the planarization is effected using a CMP process. For one embodiment, the polishing process is used to remove the second oxide layer 304 and the nitride layer 303 is used as a polish stop. For such an embodiment, the polish has a high selectivity between oxide and nitride. For an alternative embodiment, the second oxide layer 304 is selectively etched to the nitride layer 303. Subsequently, the nitride layer 303 is etched using a wet etch process using, for example, phosphoric acid. The first oxide layer 302 acts as an etch stop for such a process.

Figure 3F:
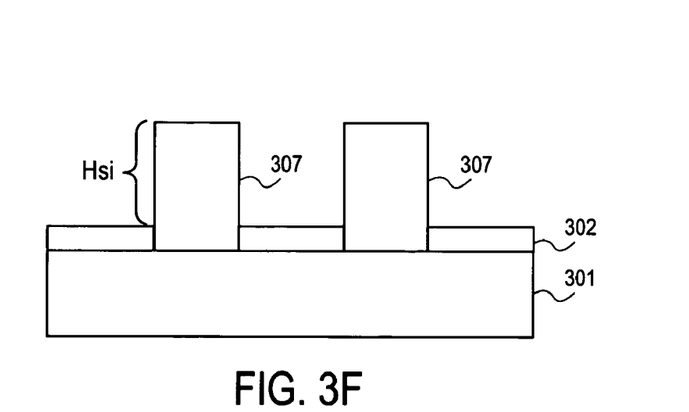

FIG. 3F illustrates the silicon bodies for the tri-gate transistors exposed with the removal of the trench layer (e.g., second oxide layer 304 and the nitride layer 303). As shown in FIG. 3F, a portion of the trench layer (e.g., first oxide layer 302) may be retained to effect beneficial properties of the transistor as explained below. The silicon 307 forming the gate bodies has a uniform height to within a specified tolerance. For one embodiment, the height, $H_{Si}$, of silicon 307 is approximately 10 nm and is uniform within 5%.

Figure 3G:
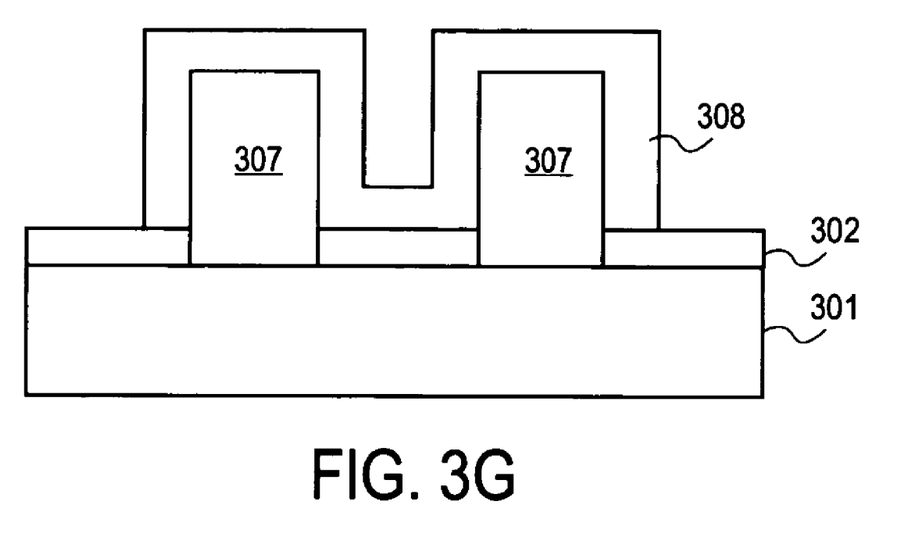

FIG. 3G illustrates the tri-gate transistor fabricated by forming a gate 308 surrounding the silicon 307. The gate 308 may be, for example, metal or another suitable material as known in the art.

General Matters

Embodiments of the invention include various operations. Many of the methods are described in their most basic form, but operations can be added to or deleted from any of the methods without departing from the basic scope of the invention. For example, the trench layer, described in operation 205 of FIG. 2, may be disposed on the substrate in various alternative matters and may be comprised of more than one layer as illustrated in FIG. 3A. Furthermore, a portion of the trench layer may be retained to effect benefits. As shown in FIGS. 3F and 3G, a portion of the first oxide layer is retained to reduce fringe capacitance in the transistor.

As described above, the trenches formed in the trench layer may be filled with silicon in a number of ways including, for example, blanket deposition of polysilicon. For an embodiment in which a blanket deposition of polysilicon is used, an annealing process is employed after deposition to anneal the silicon into a single crystal.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   disposing a trench layer upon a semiconductor substrate;
   forming one or more trenches in the trench layer exposing the semiconductor substrate;
   epitaxially growing a semiconductor material within the one or more trenches to fill the one or more trenches; and
   removing a portion of the trench layer to expose the semiconductor material as one or more semiconductor fins.

2. The method of claim 1 wherein the trench layer is comprised of a plurality of layers.

3. The method of claim 2 wherein the plurality of layers include a first oxide layer disposed upon the semiconductor substrate, a nitride layer disposed upon the first oxide layer, and a second oxide layer disposed upon the nitride layer.

4. The method of claim 3 wherein removing a portion of the trench layer comprises removing any remaining portion of the second oxide layer, any remaining portion of the nitride layer, and retaining at least some portion of any remaining portion of the first oxide layer.

5. The method of claim 1 wherein the one or more trenches have a depth of approximately 10 nm.

6. The method of claim 5 wherein the one or more semiconductor fins have a height of approximately 10 nm that is uniform to within 5%.

7. The method of claim 1, further comprising:
planarizing the semiconductor material to a surface of the trench layer prior to exposing the semiconductor material as one or more semiconductor fins.

8. The method of claim 1 wherein filling the one or more trenches with a semiconductor material includes a blanket deposition of semiconductor material.

9. A method comprising:
disposing a first oxide layer on a semiconductor substrate;
disposing a nitride layer upon the first oxide layer;
disposing a second oxide layer upon the nitride layer;
selectively etching a portion of the second oxide layer, the nitride layer and the first oxide layer to define one or more trenches;
epitaxially growing a semiconductor material within the one or more trenches to fill the one or more trenches; and
selectively etching a remainder of the second oxide layer to form one or more semiconductor bodies from the semiconductor material.

10. The method of claim 9 wherein the one or more trenches have a depth of approximately 10 nm.

11. The method of claim 9 wherein the one or more semiconductor bodies have a height of less than 20 nm that is uniform to within 5%.

12. The method of claim 11 wherein the one or more semiconductor bodies have a height of approximately 10 nm.

13. The method of claim 9 further comprising:
planarizing the semiconductor material to a surface of the second oxide layer.

14. The method of claim 9 wherein the semiconductor substrate is comprised of a semiconductor material selected from the group consisting of silicon, germanium, and gallium arsenide.

15. The method of claim 9 wherein the semiconductor substrate is comprised of silicon, the first oxide layer is comprised of $SiO_2$, the nitride layer is comprised of $Si_3N_4$, and the second oxide layer is comprised of $SiO_2$.

16. A method comprising:
forming a first film over a semiconductor substrate;
forming a second film on said first film;
forming a trench in said first film and said second film and exposing the semiconductor substrate;
forming an epitaxial semiconductor film in said trench; and
exposing a sidewall of said semiconductor film by removing said second film selectively from said first film.

17. The method in claim 16, further comprising:
forming a gate dielectric on said sidewall of said semiconductor film;
forming a gate electrode on said gate dielectric; and
forming a source and drain region in said semiconductor film on opposite sides of said gate electrode.

18. The method in claim 16, wherein said first film is a silicon nitride and said second film is a silicon oxide.

19. The method in claim 16, wherein said first film is a silicon oxide and said second film is a silicon nitride.

20. The method in claim 16, further comprising:
removing any excess semiconductor material from said trench prior to exposing a sidewall of said semiconductor film.

* * * * *